(12) United States Patent
Song et al.

(10) Patent No.: US 11,322,361 B2
(45) Date of Patent: May 3, 2022

(54) SELECTIVE ETCHING OF SILICON WAFER

(71) Applicant: International Business Machines Corporation, Armonk, NY (US)

(72) Inventors: Da Song, Loudonville, NY (US); Allan Ward Upham, Waterford, NY (US); Cornelius Brown Peethala, Slingerlands, NY (US); Kevin Winstel, East Greenbush, NY (US); Spyridon Skordas, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 16/539,597

(22) Filed: Aug. 13, 2019

(65) Prior Publication Data

US 2019/0371615 A1    Dec. 5, 2019

Related U.S. Application Data

(60) Continuation-in-part of application No. 14/824,106, filed on Aug. 12, 2015, now abandoned, which is a division of application No. 14/300,679, filed on Jun. 10, 2014, now Pat. No. 9,378,966.

(51) Int. Cl.
*H01L 21/306* (2006.01)
*H01L 29/167* (2006.01)
*H01L 21/67* (2006.01)
*C09K 13/08* (2006.01)

(52) U.S. Cl.
CPC ........ *H01L 21/30604* (2013.01); *C09K 13/08* (2013.01); *H01L 21/6708* (2013.01); *H01L 29/167* (2013.01)

(58) Field of Classification Search
None
See application file for complete search history.

(56) References Cited

U.S. PATENT DOCUMENTS

| 4,076,557 A * | 2/1978 | Huang ................. H01L 21/033 257/E21.033 |
| 4,239,559 A * | 12/1980 | Ito ......................... H01L 21/321 438/144 |
| 4,681,657 A * | 7/1987 | Hwang ............. H01L 21/30604 252/79.3 |
| 5,518,966 A | 5/1996 | Woo |
| 5,937,312 A * | 8/1999 | Iyer ................... H01L 21/76251 438/459 |
| 5,961,877 A | 10/1999 | Robinson |
| 6,251,712 B1 * | 6/2001 | Tanaka ............. H01L 29/66757 257/E21.413 |

(Continued)

OTHER PUBLICATIONS

Bag, "5 Characterising Etching Processes in Bulk Micromachining", Micromanufacturing and Nanotechnology, 2006, pp. 83-105.

(Continued)

*Primary Examiner* — Sylvia MacArthur
(74) *Attorney, Agent, or Firm* — L. Jeffrey Kelly

(57) ABSTRACT

An apparatus that includes a solution bath of a seasoned solution, the seasoned solution containing a mixture of hydrofluoric acid, nitric acid, and acetic acid; and one or more silicon wafers being suspended in a position above the solution bath, wherein at least a portion of the mixture having been used in thinning the one or more silicon wafers.

20 Claims, 7 Drawing Sheets

(56) References Cited

U.S. PATENT DOCUMENTS

| | | | |
|---|---|---|---|
| 6,780,277 B2 | 8/2004 | Yokomizo | |
| 7,591,922 B2 | 9/2009 | Okamoto | |
| 7,976,718 B2* | 7/2011 | Kashkoush | H01L 21/31111 216/93 |
| 8,048,807 B2 | 11/2011 | Liu | |
| 8,158,506 B2 | 4/2012 | Kim | |
| 8,716,145 B2 | 5/2014 | Huang | |
| 9,378,966 B2 | 6/2016 | Peethala | |
| 10,520,416 B2* | 12/2019 | Takahashi | H01L 21/67086 |
| 2004/0256379 A1* | 12/2004 | Kirby | H05B 3/58 219/535 |
| 2004/0256979 A1* | 12/2004 | Murakami | H01L 27/3248 313/503 |
| 2007/0281488 A1 | 12/2007 | Wells | |
| 2008/0185636 A1* | 8/2008 | Luo | H01L 29/66545 257/327 |
| 2009/0081881 A1* | 3/2009 | Kiyose | H01L 21/67086 438/753 |
| 2009/0141583 A1 | 6/2009 | Fanjat | |
| 2011/0104480 A1 | 5/2011 | Malekos | |
| 2013/0137277 A1 | 5/2013 | Huang | |
| 2013/0260569 A1 | 10/2013 | Ganster | |
| 2015/0357207 A1 | 12/2015 | Peethala | |

OTHER PUBLICATIONS

Chen et al.,"A Novel MEMS Field Emission Accelerometer Based on Silicon Nanotips Array", International Symposium on Photoelectronic Detection and Imaging 2011, Proc. of SPIE vol. 8191, pp. 819127-1 thru 819127-8.

Kovacs et al., "Bulk Micromachining of Silicon", Proceedings of the IEEE, vol. 86, No. 8, Aug. 1998, pp. 1536-1551.

Kulkarni et al, "Acid-Based Etching of Silicon Wafers: Mass-Transfer and Kinetic Effects", Journal of The Electrochemical Society, vol. 147, No. 1, pp. 176-188, 2000.

Milind et al. (Acid-Based Etching of Silicon Wafers: Mass-Transfer and Kinetic Effects, Journal of The Electrochemical Society, 147 (1) 176-188 (2000) The Electrochemical Society, Inc.) Used Only as Evidence.

IBM: List of IBM Patents or Patent Applications Treated as Related (Appendix P), Feb. 5, 2020, pp. 1-2.

* cited by examiner

US 11,322,361 B2

SELECTIVE ETCHING OF SILICON WAFER

BACKGROUND

The present invention relates to the field of semiconductor device manufacturing. In particular, it relates to a method of etching silicon wafer, and to apparatus and solution used in or by the method.

State of art semiconductor device manufacturing technologies include, for example, deposition and etching techniques that are most commonly used to add material to or remove material from certain areas of a functional device structure, or a portion thereof, in a process of forming that device, be that material metallic, semiconductor, dielectric, or insulating material. For example, among the various etching techniques, processes using certain types of chemical solutions are widely used. In particular such processes, known as wet etching process or WETS, may be used in thinning semiconductor wafers in a three-dimensional (3-D) semiconductor device integration process.

Nevertheless, currently available WETS processes commonly used in thinning semiconductor wafers have individually their own shortfalls. For example, some wet etching processes may employ special chemical solutions including, for example, tetramethylammonium hydroxide (TMAH) solution, potassium hydroxide (KOH) solution, and ethylene diamine and pyrocatechol (EDP) solution but these processes generally have the property of anisotropic etching. In other words, their etch profiles depend on wafer crystallographic orientation i.e. (111), (110), etc., which as a result do not suit for wafer scale silicon removal.

On the other hand, some other wet etching processes that rely on a mixture solutions of for example $HF—HNO_3—H_2SO_4$, although being able to provide isotropic etch with high etch rate, have no doping selectivity and thus cannot provide adequate etch stop mechanism that may be required in order to control the etching process. In the meantime, although there are some other traditional wet etching processes but they generally have very low etch rate.

SUMMARY

Embodiments of the present invention provide a method of preparing an etch solution, and using the etch solution in thinning semiconductor wafers. More specifically, the method includes creating a mixture of hydrofluoric acid, nitric acid, and acetic acid in a solution container in an approximate 1:3:5 ratio; causing the mixture to react with portions of one or more silicon wafers, the portions of the one or more silicon wafers are doped with boron in a level no less than $1\times10^{19}$ atoms/cm$^3$; collecting the mixture after reacting with the boron doped portions of the one or more silicon wafers; and adding collected mixture back into the solution container to create the etch solution.

In one embodiment, the method further includes causing the collected mixture to react with portions of the one or more silicon wafers; and collecting the collected mixture and adding them back into the solution container.

According to one embodiment, causing the mixture to react with the portions of the one or more silicon wafers includes spraying the mixture onto the one or more silicon wafers and letting reacted mixture to drop into the solution container underneath thereof.

According to another embodiment, the one or more silicon wafers are suspended in an environmentally controlled space above the solution container.

In another embodiment, the method further includes adding a fresh mixture of hydrofluoric acid, nitric acid, and acetic acid into the solution container to sustain a stable etch rate, the added fresh mixture ranges 10~20% in volume of a total amount of solution in the solution container.

According to one embodiment, the portions of the one or more silicon wafers are one side of the silicon wafers that are heavily doped with boron.

An embodiment of present invention provides an apparatus that includes a solution bath of a seasoned solution, the seasoned solution containing a mixture of hydrofluoric acid, nitric acid, and acetic acid; and one or more silicon wafers being suspended in a position above the solution bath, wherein at least a portion of the mixture having been used in thinning the one or more silicon wafers.

BRIEF DESCRIPTION OF THE DRAWINGS

The invention will be understood and appreciated more fully from the following detailed description of preferred embodiments, taken in conjunction with the accompanying drawings of which.

Figure 1:
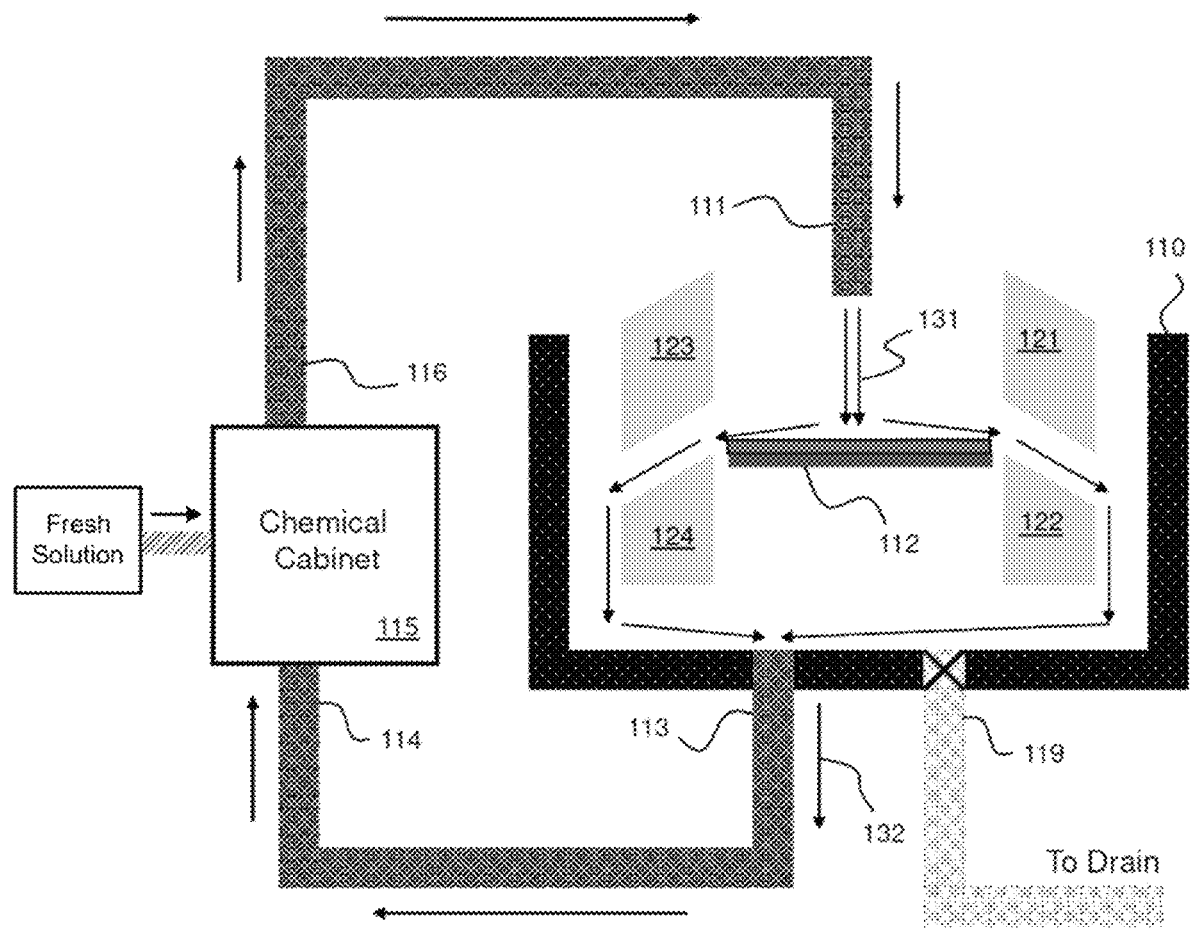
FIG. 1 is a demonstrative illustration of a method of wafer etching and an apparatus used therein having a solution re-circulation mechanism according to an embodiment of the present invention.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION

In the following detailed description, numerous specific details are set forth in order to provide a thorough understanding of various embodiments of the invention. However, it is to be understood that embodiments of the invention may be practiced without these specific details.

In the interest of not obscuring presentation of essences and/or embodiments of the invention, in the following detailed description, some processing steps and/or operations that are known in the art may have been combined together for presentation and/or for illustration purpose and in some instances may have not been described in detail. In other instances, some processing steps and/or operations that are known in the art may not be described at all. In addition, some well-known device processing techniques may have not been described in detail and, in some instances, may be referred to other published articles, patents, and/or patent applications for reference in order not to obscure description of essences and/or embodiments of the invention. It is to be understood that the following descriptions have rather focused on distinctive features and/or elements of various embodiments of the invention.

FIG. 1 is a demonstrative illustration of a method of semiconductor wafer etching as well as an apparatus used therein that has a solution re-circulation mechanism according to an embodiment of the present invention. More specifically, the apparatus may include at least a solution bath 110, at the bottom of which there may be a solution re-circulation port 113 and a drain port 119. During the use of solution bath 110 in etching/thinning semiconductor wafers, drain port 119 may be closed. Solutions collected by solution bath 110 after being used in the thinning of wafers (thus sometimes being referred to as waste solution or used solution) may be channeled 132 via re-circulation port 113 into a chemical cabinet 115 through an input port 114 of the chemical cabinet 115. Coming out of an output port 116 of the chemical cabinet 115, the solutions, possibly with newly added chemicals from chemical cabinet 115, may be re-applied to the semiconductor wafers, such as wafers 121, 122, 123, and 124 that are inside solution bath 110 undergoing the thinning process. In some embodiment, new chemicals are periodically added in order to sustain a stable etch rate on silicon. As an example, the new chemical may simply be a fresh solution of what was originally in bath 110, which is then mixed with the used solution to maintain stable etch rate. When being added, the newly added fresh solution may be, for example, 10 to 20 vol. % of the total solution in solution bath 110.

According to an embodiment, during a wafer thinning process chemical solutions (such as one with hydrofluoric acid, nitric acid, and acetic acid known as HNA solution) may be re-circulated through ports 113, 114, 116 and chemical cabinet 115 to be re-applied to semiconductor wafers 121, 122, 123, and 124 through for example a spray nozzle 111 or any other solution outlet port. More specifically, as being demonstratively illustrated in FIG. 1, in an embodiment solution 131 coming out of nozzle 111 may be applied to a spinning platform 112. Spinning platform 112 may subsequently through its spinning motion spray or distribute solution 131, referred to herein as seasoned solution 131 after solution re-circulation, onto surrounding semiconductor wafers such as wafers 121, 122, 123, and 124 as being illustrated in FIG. 1. Other solution spraying or applying mechanism may be used as well.

In an embodiment, semiconductor wafers 121, 122, 123, and 124 may be held to suspend in air or certain regulated or controlled environment such that solutions being applied to them may drip away from the wafers and into underneath solution bath 110 and re-collected by re-circulation port 113.

According to an embodiment, it is unexpectedly discovered that seasoned HNA solution 131 may contain a high level of concentration of nitride-oxide, $NO_x$ (for example NO or NO2), provided uniquely by the wafer thinning process, which helps etch heavily doped semiconductor wafers and in particular heavily boron (B) doped silicon wafers. For example, after starting an etching process with solution re-circulation mechanism, when it reaches to about 10% of volume in the solution mixture coming from re-circulation, it has been observed that etch rate of heavily doped silicon wafer may reach a steady level of approximate 5 μm/min, with the wafer under thinning having a boron doped level of approximate $1\times10^{19}$ atoms/cm$^3$. This etch rate is confirmed to be more than 6 times faster than the about 0.8 μm/min etch rate being commonly observed in non-circulation (therefore non-seasoned) HNA solution.

Figure 2:
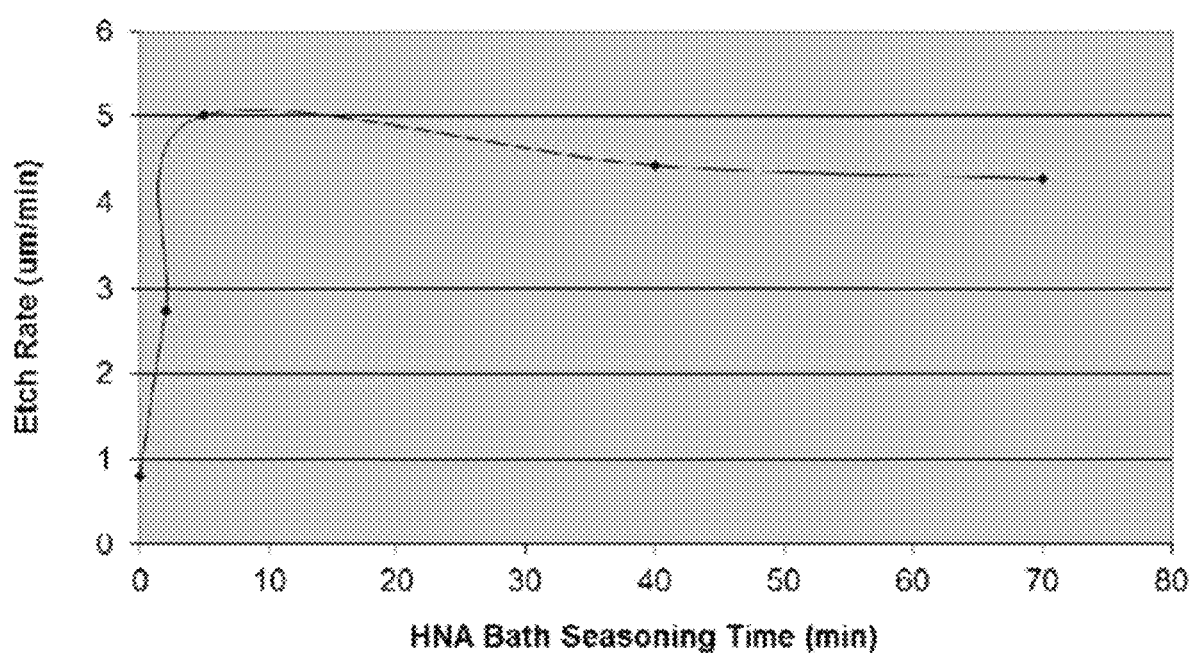
FIG. 2 is a sample experimental chart illustrating rapid etch rate change using solution re-circulation according to an embodiment of the present invention.

FIG. 2 is an exemplary sample experimental chart illustrating rapid etch rate increase with an HNA solution bath using solution re-circulation mechanism according to an embodiment of the present invention. In the chart illustrated in FIG. 2, x-axis denotes seasoning time of the HNA solution bath, expressed in minute. In other word, x-axis represents the time lapsed when HNA solution starts to be sprayed or applied onto heavily boron doped silicon wafers while in the meantime waste solution (or used solution) is being collected by solution bath 110 through re-circulation port 113 (FIG. 1) and re-applied to the silicon wafers. Y-axis denotes silicon wafer etch rate expressed in micrometer (m) per minute. It is to be noted that the silicon wafer etch rate is only measured on one side of the wafer since the other side is not conditioned, such as heavily boron doped, to be etched.

In the chart shown in FIG. 2, it is clearly observed that the etch rate of silicon wafer increases dramatically within the initial approximate 5 minutes, starting at around 0.8 μm/min, which is the typical etch rate of silicon wafers in a non-seasoned HNA bath, to around 5 μm/min when the solution bath may be considered as being fully seasoned, that is, having at least 10 vol. % of re-circulated solution of the total solution volume in the solution bath. In other words, after approximately 5 minutes, the solution bath may be conditioned to become having sufficiently high level of $NO_x$ that in turn aids the etching of wafers that are heavily doped by p-type dopants such as boron. After approximately 5 minutes the etching rate, in the illustrated chart of experiment, tapers down slightly and eventually settles at around a steady level of about 4.2~4.3 μm/min. This tapering may partially be due to the solution in solution bath reaching equilibrium and is considered to be mainly caused by slight lag in reaching uniform mixture through solution recirculation. In a 3-D semiconductor device integration process, the etching or thinning process trims down the thickness of silicon wafer to a level that is desirable for the integration.

Figure 3A:
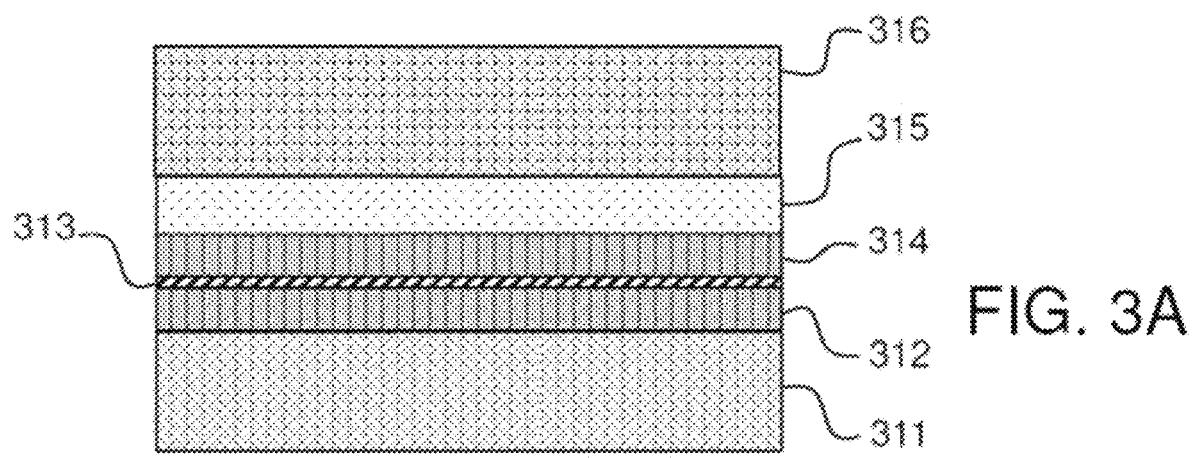
FIGS. 3A-3C are demonstrative illustrations of cross-sectional views of a wafer subjecting to a wafer thinning process according to an embodiment of the present invention.
Figure 3B:
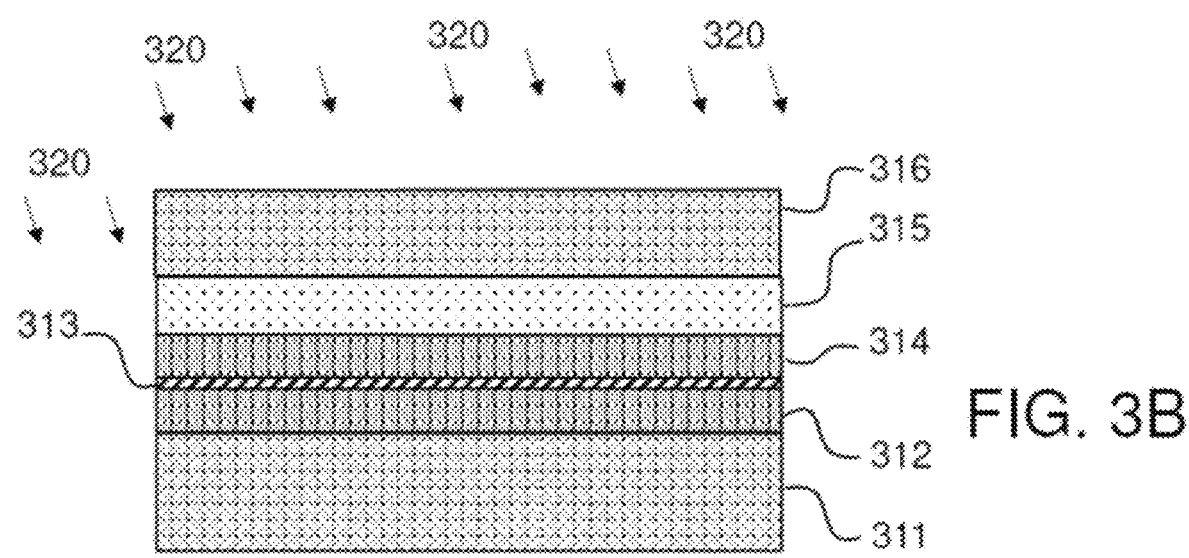
Figure 3C:
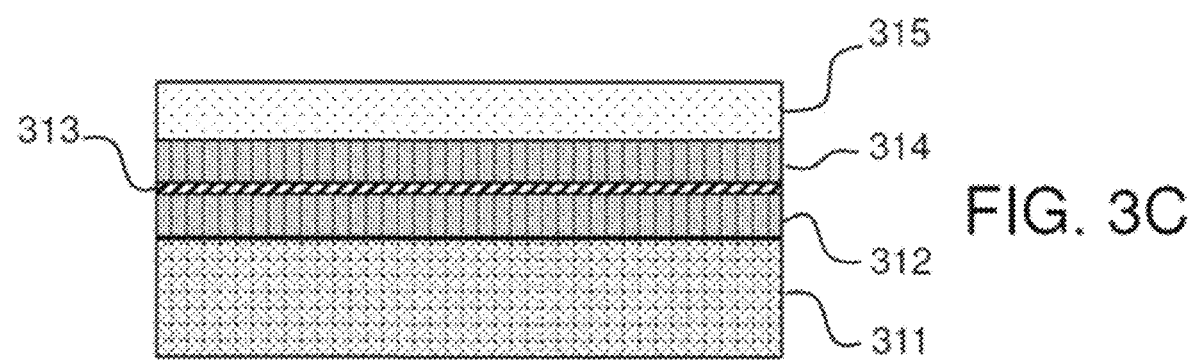

FIGS. 3A-3C are demonstrative illustrations of cross-sectional views of a semiconductor wafer being subjected to a wafer thinning process according to an embodiment of the present invention. For example, in a 3-D integration process of manufacturing semiconductor devices, embodiments of present invention may be applied in removing a handler substrate. More specifically as being illustrated demonstratively in FIG. 3A, during manufacturing, a first device layer 312 may be formed on a first substrate 311, and a second device layer 314 may be formed on a second substrate 316. Here, the second substrate 316 may be known as a handler substrate and may be heavily doped with boron (B) 320. Device layer 314 may be formed on top of second substrate 316 or handler substrate via a lightly doped layer 315. Lightly doped layer 315 may be, for example, epitaxially grown on top of second substrate 316. In FIG. 3A, the second device layer 314 may be illustrated upside-down and be bonded together with the first device layer 312 through a bonding layer 313, which may be for example activated silicon oxide, silicon nitride, metal oxide hybrid bonding layer, polymeric adhesive materials, etc.

In an embodiment, the heavily doped handler substrate 316 may be doped with a dopant level of at least $1\times10^{19}$ atoms/cm$^3$, compared with the lightly doped layer 315 which may typically be doped at between about $1\times10^{15}$ cm$^3$ and $1\times10^{16}$ atoms/cm$^3$ in dopant level. In other words, dopant level in handler substrate 316 may be at least 1000 times higher than that in layer 315. In a 3-D integration process, handler substrate 316 may be removed after integration. In removing handler substrate 316, according to an embodiment of present invention, a significant portion of handler substrate 316 may first be removed through a grinding or polishing process, which may rapidly reduce the thickness of handler substrate 316 to close to, for example, 10~12 μm. With a portion of handler substrate 316 (10~12 μm) still remaining on top of lightly doped layer 315, seasoned HNA solution may be applied or sprayed onto substrate 316, as being illustrated in FIG. 3B, which etches and removes the remaining portion of substrate 316. This wet etch process may slow down dramatically to stop at lightly doped layer 315 by virtue of the dopant level in layer 315. For example, layer 315 may be a p-type dopant (such as boron) doped silicon epitaxial layer with a dopant concentration level around approximately $1\times10^{15}$ to $1\times10^{16}$ atoms/cm$^3$, as being illustrated in FIG. 3C.

According to an embodiment, seasoned HNA solution may be prepared by first creating a mixture of chemical solution having HF:HNO3:CH3COOH in a ratio of approximate 1:3:5 in weight, although embodiment of present invention is not limited in this aspect and certain variation of the ratio of chemical components are acceptable and within the spirits of present invention. For example, ratio variation of above chemicals may range as follows: HF1:HNO3 3~6:CH3COOH 3~5 with HF being as a reference set at 1. It should be noted that other concentration variations outside the suggested range may be used as well, depending upon what the etch rate is desirable. In an embodiment, it is observed that etching and removing of a 12 μm thick substrate 316 took about 2.5 minutes, which is to be compared with the approximate 15 minutes that would otherwise be needed when a conventional, unseasoned HNA solution is used as the best-known method (BKM) process. For clarification, the 2.5 minutes does not include any additional time for wafer handling and rinsing.

Figure 4:
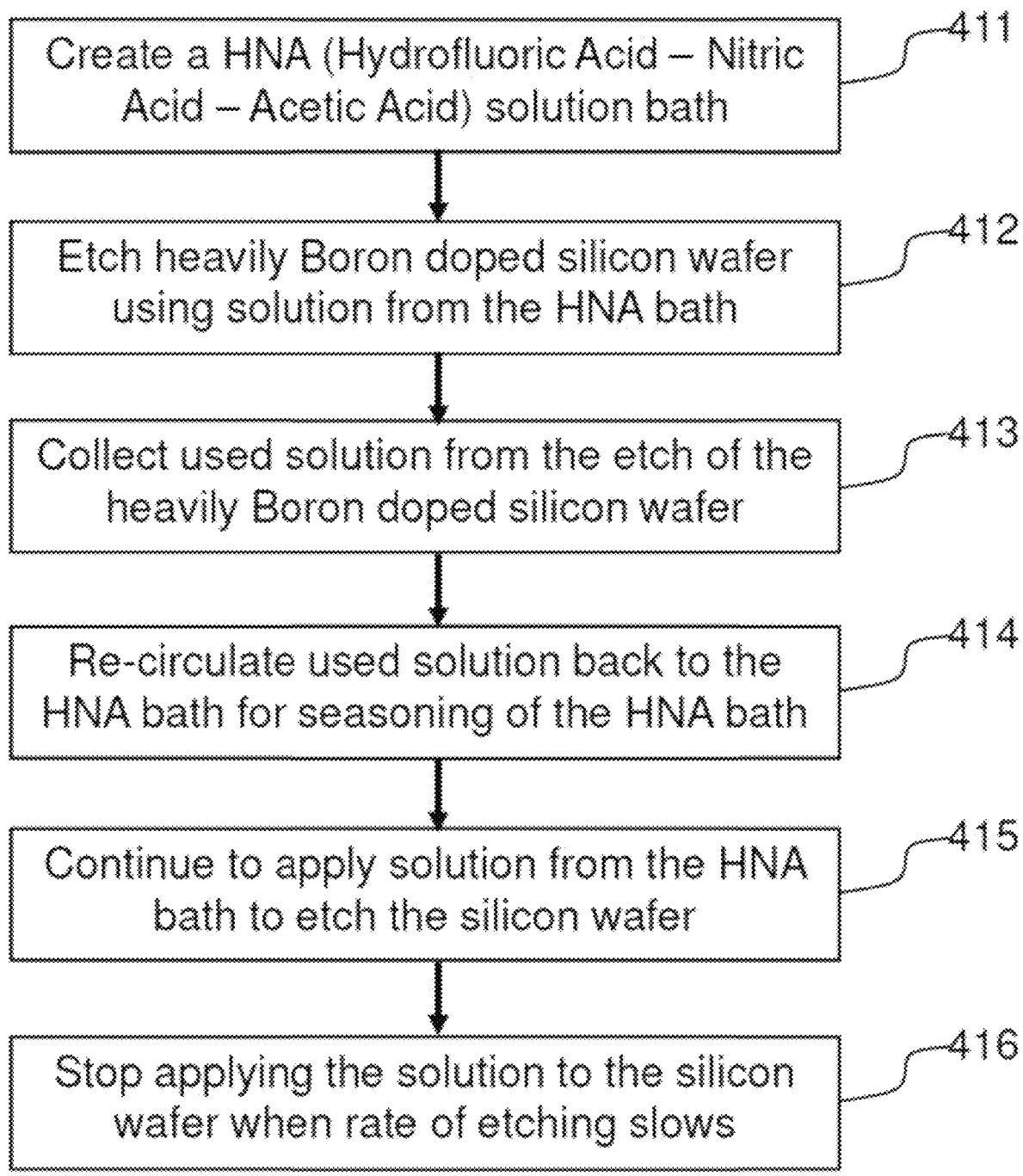
FIG. 4 is a simplified flow-chart illustration of applying a solution re-circulation mechanism in a wafer etching process, according to an embodiment of the present invention.

FIG. 4 is a simplified flow-chart illustration of a method of creating a seasoned solution using re-circulation mechanism and applying the seasoned solution in a wafer thinning process, according to an embodiment of present invention. More specifically, an embodiment of a method of present invention may include steps of first creating a HNA solution bath at step 411, by mixing hydrofluoric acid, nitric acid, and acetic acid in a pre-determined mix ratio such as a ratio of about 1:3:5, although slightly higher or lower content (within for example 5% relative to others) of each acid are fully contemplated by present embodiment as well. In each of the mixing chemical solutions, water is an integral part and concentration of the chemicals may be, for example, HF 49 wt. %, nitric acid 70 wt. % and acetic acid 98 wt. % respectively. After the creation of the solution additional water may be added depending on the intended application, although not necessarily needed, with the effect of dilution where adding water generally will lower the etch rate. Next at step 412, the prepared mixture of chemical solution may be applied, such as through a spray-on process, onto heavily doped (such as heavily boron doped) silicon wafers and in particular to the side (or sides) of the silicon wafers that are boron doped for the purpose of etching and/or thinning thereof. Solution coming off these wafers, known as waste solution or used solution, may then be collected at step 413 by using for example a solution bath, and subsequently re-circulated back to be applied to the wafers and re-collected by the solution bath at step 414 to create seasoned bath solution. After a certain number of re-circulation, the solution may become seasoned solution to contain a desired level of NO$_x$ (such as NO or NO$_2$), that is discovered to be advantageous to the etching of wafers, and the seasoned solution may be re-used and re-applied to the silicon wafer for further thinning the substrate at step 415. In the seasoned solution, the level of NO$_x$ may be proportional to the concentration of HNO$_3$ and in approximate 1:1~2 molar ratio. Once most of the heavily doped portions of silicon is etched away and underneath lightly doped (less than $1\times10^{15}$ atoms/cm$^3$) portion of wafer is exposed, the etching rate may significantly slow down to close to zero at which point the wafer thinning process may be considered as accomplished, at step 416.

Figure 5:
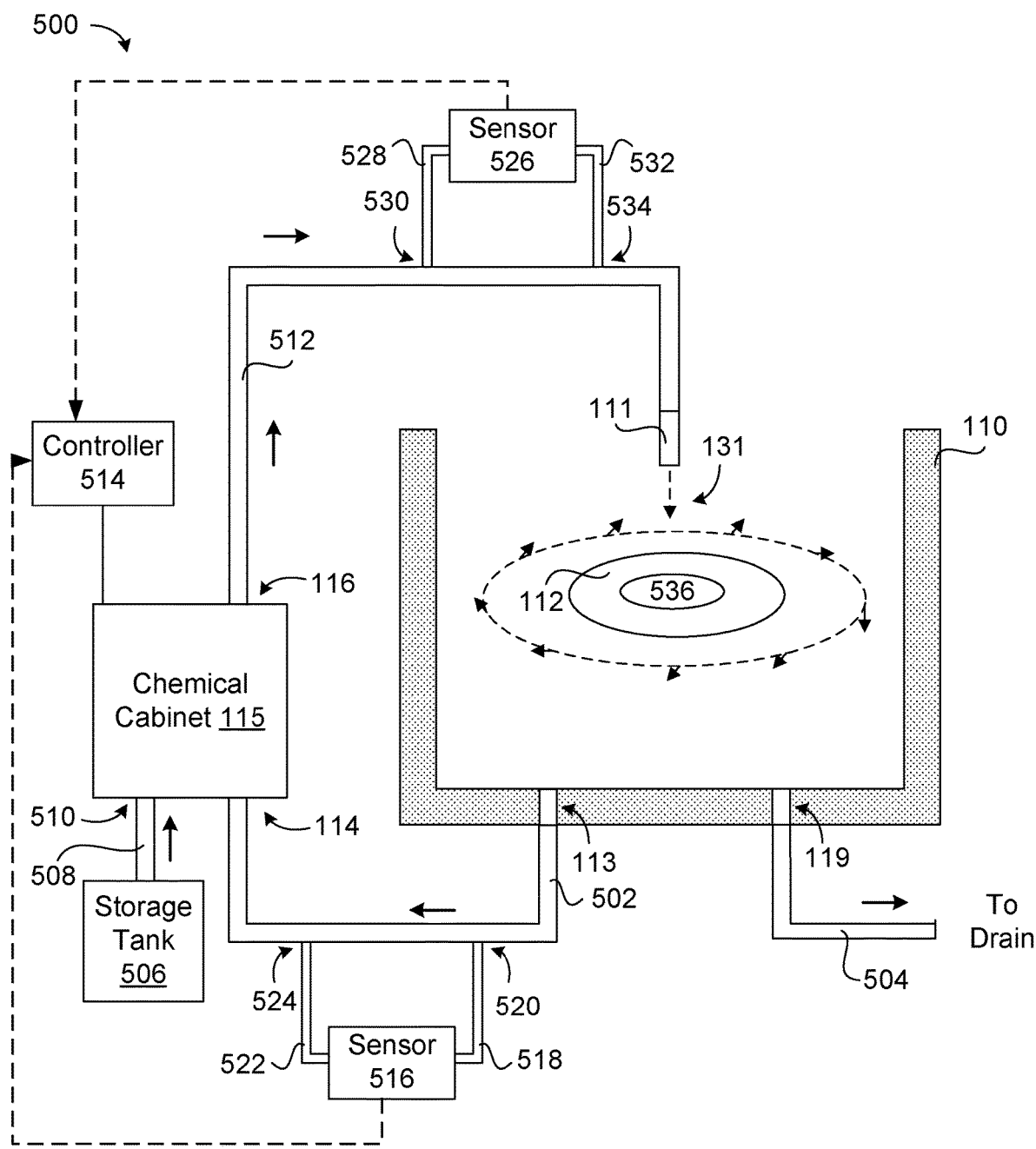
FIG. 5 is a demonstrative illustration of wafer etching and an apparatus used therein having a solution re-circulation mechanism according to an embodiment of the present invention.

FIG. 5 is a further detailed demonstrative illustration of a wafer etching apparatus 500, hereinafter "apparatus" 500, according to an embodiment of the present invention. The apparatus 500 includes the recirculation mechanism described above with additional features and components.

Similar to the mechanism described above with respect to FIG. 1, the apparatus 500 may include the solution bath 110, the spray nozzle 111, the spinning platform 112, the solution re-circulation port 113, the input port 114, the chemical cabinet 115, the output port 116, the drain port 119 and the solution 131.

The apparatus 500 may include a pipe 502 connected from the solution re-circulation port 113 to the chemical cabinet 115 through input port 114, and a pipe 504 connected from the drain port 119 to the drain. Storage tank 506 may be connected via a pipe 508 to the chemical cabinet 115 through input port 510. The output port 116 from the chemical cabinet 115 may be connected to the spray nozzle 111 via pipe 512. The apparatus 500 may further include a controller 514, either electrically or wirelessly connected to the chemical cabinet 115. There may be one or more sensors, such as sensor 516 and sensor 526. There may be a wafer 536 mounted on the spinning platform 112.

In some embodiments, the apparatus 500 may include two or more solution baths 110, plumbed in series or in parallel, and each solution bath may have one or more spray nozzles 111, and one or more spinning platforms 112.

The wafer 536 may be held by pins, not shown, on an edge of the wafer 536 which hold the wafer 536 in place on the spinning platform 112. There may be a chuck, for example an aluminum chuck, which the spinning platform 112 is mounted on, while the solution 131 is sprayed by the spray nozzle 111.

The solution bath 110 may be referred to as a chamber cup that holds the solution bath during wafer processing with two outlets 113 and 119.

The solution bath 110 may have sides which extend above the wafer 536, such that the solution 131 is collected by the solution bath, for example when exiting the spray nozzle 111.

The storage tank 506 may have one or more input ports, each of which contains a mix of one or more chemical additives which may be mixed with and introduced into the solution 131 through the chemical cabinet 115, depending on a recipe used by the controller 514. The chemicals to the input ports of the storage tank 506 may include deionized water, hydrofluoric acid (HF), nitric acid (HNO$_3$), and acetic acid (CH$_3$COOH), among other chemicals.

Inputs to the controller 514 may include inputs from the one or more sensors 516, 526 connected either electrically or wirelessly to the controller 514. The sensors 516, 526 may monitor the solution 131 as it flows through the pipes 502, 504, 512. A portion of the solution 131 may be monitored as it flows from the pipe 502, through a port 520 to a pipe 518, through the sensor 516, and back to the pipe 502 through a pipe 522 via a port 524. The sensor 516 may perform tests on the solution 131 as it moves from the solution bath 110 to the chemical cabinet 115. Similarly, a portion of the solution 131 may be tested while it flows from the pipe 512 through a port 530 to a pipe 528, through the sensor 526, and back to the pipe 512 through a pipe 532 via a port 534. The sensor 526 may perform tests on the solution 131 as it flows from the chemical cabinet 115 to the solution bath 110. There may be additional sensors monitoring the solution 131 at alternate positions in the apparatus 500, and also additional sensors monitoring other chemicals used in the apparatus 500, for example chemicals flowing through the storage tank 506. There may be more than 2 sensors 516, 526.

Measurements of the solution 131 by the sensors 516, 526 may be dynamically performed on the solution 131 to monitor seasoning of the solution 131 as it is exposed to the wafer 536 being etched in the solution bath 110. As the solution 131 becomes more seasoned, a recipe for the solution 131 may change. Changes in the recipe may include changes in ratios of each of the input chemicals and the solution 131 in circulation through the solution bath 110 and the chemical cabinet 115, and may result in a portion of the solution 131 being discharged to the drain through the pipe 504.

Examples of measurements performed by the sensors 516, 526 may include molar ratio measurements, ion chromatography, pH measurements, conductivity measurements, measuring of HF acid concentration, and silicate concentration measurements, among other measurements. The measurements may be done to measure concentrations of chemicals initially used to create the solution 131, or alternatively to measure chemicals formed as a result of seasoning the solution 131 from etching a wafer 536 in the apparatus 500. For example, UV Visible Spectroscopy may be used to calculate the molar ratio of $NO_x$ to $HNO_3$ in the solution 131.

The controller 514 may maintain a set of instructions to control and monitor the apparatus 500, including obtaining and maintaining the solution 131 with desired characteristics, for example to maintain a molar ratio of $NO_x$ to HNO3 in approximate 1:1~2, in order to etch the wafer 536.

The controller 514 may control operation of the apparatus 500, which includes managing the flow of the solution 131 by controlling the ports by opening, closing, or partially opening each of the ports, or valves, for example by a percentage open or a percentage closed. The ports include the solution re-circulation port 113, the input port 114, the output port 116, the drain port 119, the input port 510, and the ports 520, 524, 530, 534.

The controller 514 controls an amount of the solution 131 flushed through the drain via the pipe 504, controlled by the drain port 119. The controller may how much of the solution 131 is re-circulated via the pipe 502 to the chemical cabinet 115, controlled by the re-circulation port 113. The controller 514 controls an amount and type of chemicals introduced to the solution 131 from the storage tank 506 to the chemical cabinet 115 through the pipe 508 controlled by the input port 510. The controller 514 manages a flow rate through the pipes, including the pipes 502, 504, 508, 512, 518, 522, 528 and 532, and the ports 113, 114, 116, 119, 520, 524, 530 and 534. The controller 514 manages a frequency and type of monitoring performed by the sensors 516, 526. The controller 514 manages an amount and speed of dispersion of the solution 131 through the spray nozzle 111, and a rate of rotation of the spinning platform 112.

The controller 514 may have a recipe which defines a mixing ratio of each of the chemicals of the fresh solution and the solution 131. The controller 514 may select a recipe to be used for the solution 131 dependent on user input, an amount of seasoning or usage of the solution 131, and the wafer 536. For example, when the wafer 536 is a wafer used for seasoning the solution 131, a first recipe may be used. Alternatively, when the wafer 536 is a production wafer, and the solution 131 is seasoned as desired, a second recipe may be used. In an embodiment, selection of a recipe is dependent on inputs to the controller 514 from the user and from the sensors 516, 526. In an embodiment, the controller 514 may maintain a total system volume of 30 liters of the solution 131, and may manage input from the storage tank 506 and input from the solution re-circulation port 113. In an embodiment, some solution 131 may be lost to evaporation and due to usage. The controller 514 may control the combination and mixture of mix the solution 131 and any chemical inputs to the solution 131 in the chemical cabinet 115, maintaining a ratio of the different materials, per a selected recipe and inputs to the controller 514, by controlling the re-circulation port 113, the input port 114, the output port 116, the drain port 119, the input port 510 and the ports 520, 524, 530, 534. The recipe may adjust over time and change inputs as the solution 131 becomes more seasoned. This may be determined by the amount of time the solution 131 is exposed to the wafer 121 and by inputs to the controller 514. The controller 514 may control the drain port 119 to lose a particular amount of the solution 131 to balance a volume of the solution 131 as fresh solution is introduced via the storage tank 506 into the chemical cabinet 115 to mix with the solution 131.

Once the solution 131 is seasoned, the wafer 536, which was used for seasoning, may be replaced with a new wafer 536 for production. In an embodiment, the wafers 121, 122, 123, 124, as shown in FIG. 1, may be suspended outside the solution bath and may be used for seasoning of the solution 131, and the wafer 536 may be a production wafer, placed on the chuck the solution bath 110 after the solution 131 is seasoned as required. In an embodiment, more than one wafer 536 may be etched for production, either in one apparatus 500, or in more than one apparatus 500.

In an embodiment, the wafer 536 may be sprayed by the solution 131 for etching in the solution bath 110. Following this step, the solution 131 circulation may be replaced with water which may be used to rinse the wafer 536, and subsequently, the water may be drained into a separate chamber cup similar to the solution bath 110, and the wafer 536 may be dried off. In an embodiment, nitrogen may be blown across the wafer 536 for drying.

During production, completion of etching of the wafer 536 may be timed and dependent on the recipe of the solution 131.

Figure 6:
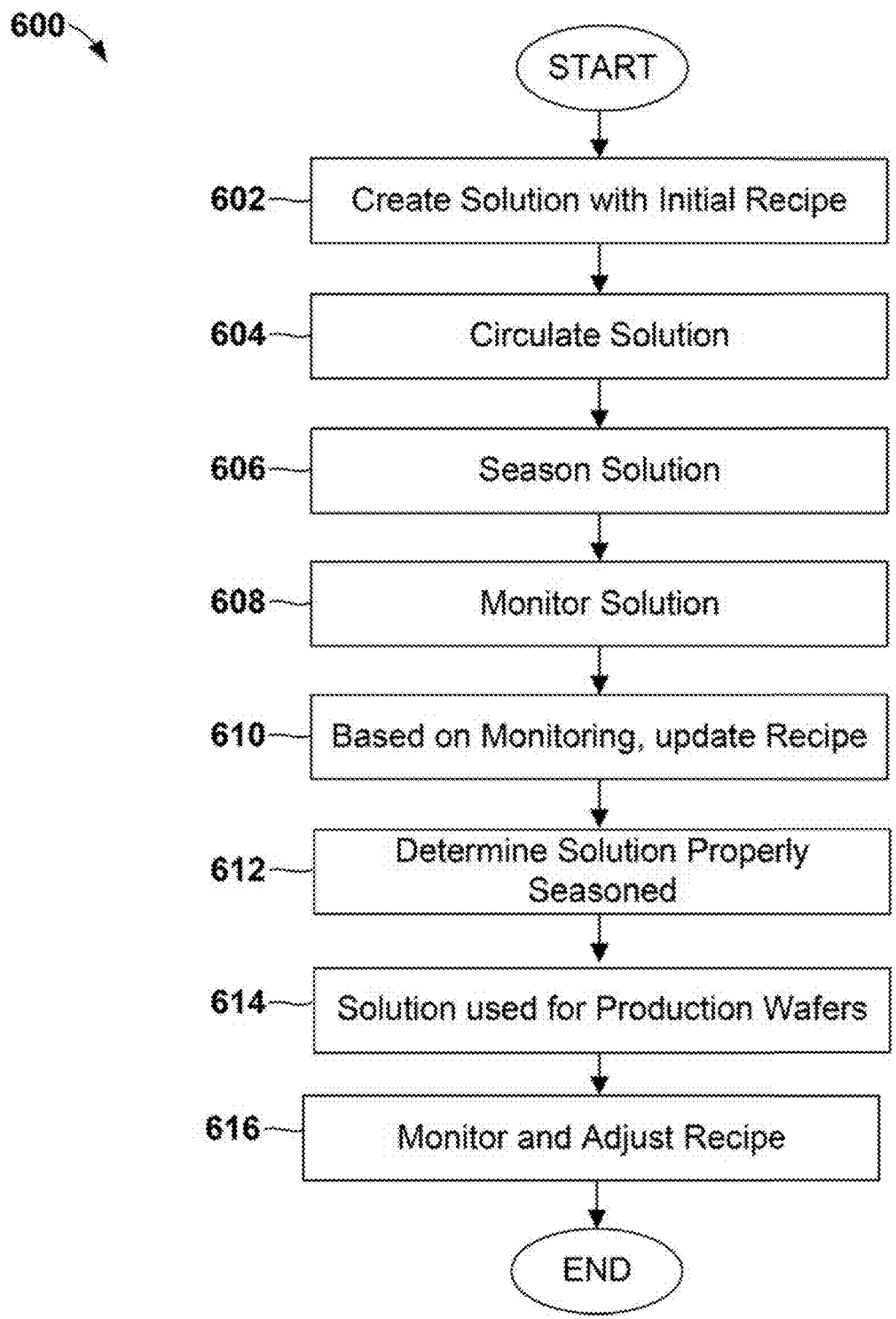
FIG. 6 is a simplified flow-chart illustration of applying a solution re-circulation mechanism in a wafer etching process, according to an embodiment of the present invention.

FIG. 6 is a simplified flow-chart illustration further detailing a method of creating a seasoned solution using the apparatus 500, according to an embodiment of the present invention.

At step 602, the controller 514 may initiate a creation of a fresh solution 131 with an initial recipe A. The recipe may define an amount of each of the chemicals from the storage tank 506 to be mixed together in the chemical cabinet 115. In an embodiment, inputs from the storage tank 506 may include hydrofluoric acid, nitric acid and acetic acid in a ratio of about 1:3:5, although slightly higher or lower content of each acid may be acceptable. The solution 131 may include deionized water as well. In an embodiment, a volume of the solution 131 may be 30 liters.

At step 604, the controller 514 may begin a circulation of the solution 131 though the apparatus 500. The controller 514 may control a pump, not shown, to manage the circulation of the solution 131. The solution 131 may circulate from the chemical cabinet 115 through the output port 116, through the pipe 512, through the spray nozzle 111, onto the wafer 536, onto the spinning platform 112, into the solution bath 110, through the solution re-circulation port 113, through the pipe 502 and into the chemical cabinet 115 through the input port 114. The controller may manage a circulation speed of the solution 131, a spinning frequency of the spinning platform 112, and a spray disbursement of the spray nozzle 111, among other things.

At step 606, the controller 514 may monitor the solution 131, for example with the sensors 516, 526. The solution 131 may become seasoned as it etches the wafer 536, which may be a wafer mounted or hanging above the solution bath 110 and used specifically for seasoning the solution 131. The wafer 536 may be heavily doped boron for this purpose.

At step 610, the controller 514 may select a new recipe B to be used in the solution 131, based on the measurements provided by the sensors 516, 526. The new recipe B may identify an amount of the solution 131 to be outputted to the drain and an amount of fresh solution from the storage tank 506, and specify the chemical composition of the fresh solution from the storage tank 506 to be mixed with a remaining amount of the solution 131 which is already circulating in the apparatus 500. The new recipe B may adjust circulation speed of the solution 131, the spinning frequency of the spinning platform 112, and the spray disbursement of the spray nozzle 111.

At step 612, the controller 514 may determine the solution 131 is properly seasoned based on continued monitoring results from the measurements provided by the sensors 516, 526.

At step 614, the controller 514 may control replacement by a wafer controller, not shown, of the wafer 536 with a production wafer 536, which is to be etched using the solution 131.

At step 616, the controller 514 may continue to monitor the solution 131, and may adjust the recipe and circulation characteristics of the solution 131 as the solution is used to etch the wafer 536.

Figure 7:
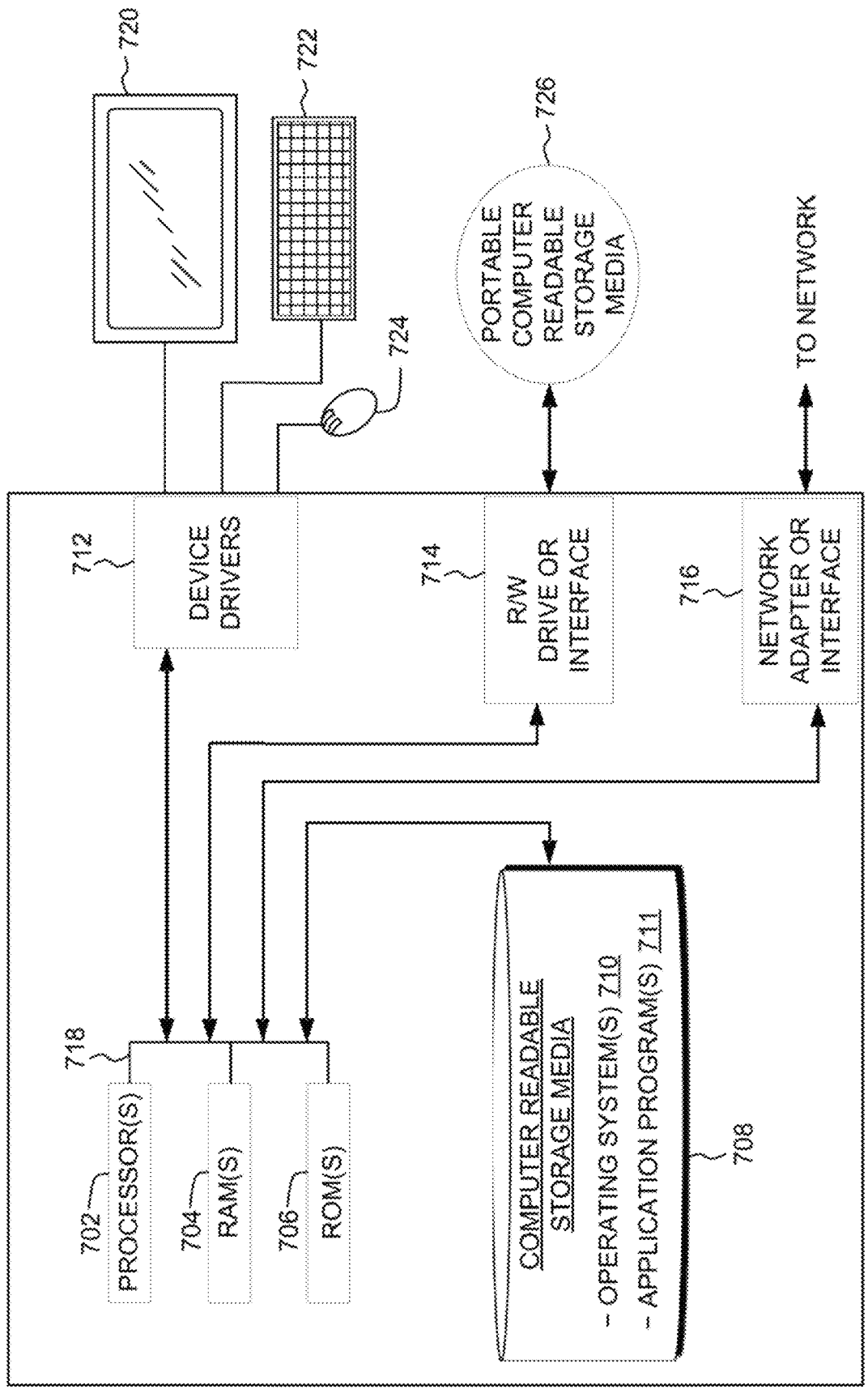
FIG. 7 is a block diagram of components of a computing device, according to an embodiment of the present invention.

Referring now to FIG. 7, a block diagram of components of a computing device, such as the controller 514 of FIG. 5, in accordance with an embodiment of the present invention is shown. It should be appreciated that FIG. 7, provides only an illustration of an implementation and does not imply any limitations with regard to the environments in which different embodiments may be implemented. Many modifications to the depicted environment may be made.

The computing device may include one or more processors 702, one or more computer-readable RAMs 704, one or more computer-readable ROMs 706, one or more computer readable storage media 708, device drivers 712, read/write drive or interface 714, network adapter or interface 716, all interconnected over a communications fabric 718. Communications fabric 718 may be implemented with any architecture designed for passing data and/or control information between processors (such as microprocessors, communications and network processors, etc.), system memory, peripheral devices, and any other hardware components within a system.

One or more operating systems 710, and one or more application programs 711 are stored on one or more of the computer readable storage media 708 for execution by one or more of the processors 702 via one or more of the respective RAMs 704 (which typically include cache memory). For example, a program for creating etch solution, may be stored on the one or more of the computer readable storage media 708. In the illustrated embodiment, each of the computer readable storage media 708 may be a magnetic disk storage device of an internal hard drive, CD-ROM, DVD, memory stick, magnetic tape, magnetic disk, optical disk, a semiconductor storage device such as RAM, ROM, EPROM, flash memory or any other computer-readable tangible storage device that can store a computer program and digital information.

The computing device may also include the R/W drive or interface 714 to read from and write to one or more portable computer readable storage media 726. Application programs 711 on the computing device may be stored on one or more of the portable computer readable storage media 726, read via the respective R/W drive or interface 714 and loaded into the respective computer readable storage media 708.

The computing device may also include the network adapter or interface 716, such as a TCP/IP adapter card or wireless communication adapter (such as a 4G wireless communication adapter using OFDMA technology). Application programs 711 may be downloaded to the computing device from an external computer or external storage device via a network (for example, the Internet, a local area network or other wide area network or wireless network) and network adapter or interface 716. From the network adapter or interface 716, the programs may be loaded onto computer readable storage media 708. The network may comprise copper wires, optical fibers, wireless transmission, routers, firewalls, switches, gateway computers and/or edge servers.

The computing device may also include a display screen 720, a keyboard or keypad 722, and a computer mouse or touchpad 724. Device drivers 712 interface to display screen 720 for imaging, to keyboard or keypad 722, to computer mouse or touchpad 724, and/or to display screen 720 for pressure sensing of alphanumeric character entry and user selections. The device drivers 712, R/W drive or interface 714 and network adapter or interface 716 may comprise hardware and software (stored on computer readable storage media 708 and/or ROM 706).

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

The invention claimed is:

1. An etch solution recirculation system comprising:
   a chemical cabinet comprising a first input, a second input and an output;
   a solution bath with a silicon wafer comprising a boron dopant level equal to or greater than $1 \times 10^{19}$ atoms/cm$^3$ suspended above the solution bath;

a seasoned etch solution discharged from the chemical cabinet via the output and sprayed above the solution bath via a spray nozzle, the seasoned etch solution becomes used etch solution after coming in contact and reacting with the silicon wafer;

a re-circulation port located at a bottom of the solution bath, wherein the re-circulation port is connected to the first input of the chemical cabinet;

a storage tank connected to the second input of the chemical cabinet, the storage tank comprising a fresh solution, the fresh solution comprising hydrofluoric acid, nitric acid and acetic acid in an approximate 1:3:5 weight ratio, wherein the fresh solution is mixed in the chemical cabinet with the used etch solution from the solution bath to produce the seasoned etch solution;

a first sensor capable of measuring concentrations of $NO_x$ and $HNO_3$ in the seasoned etch solution, wherein a portion of the seasoned etch solution from the output of the chemical cabinet flows through the first sensor;

a second sensor capable of measuring concentrations of $NO_x$ and $HNO_3$ in the used etch solution, wherein a portion of the used etch solution from the re-circulation port of the solution bath flows through the second sensor; and a controller connected to the chemical cabinet, the storage tank, the first sensor and the second sensor, the controller configured to perform a set of instructions to control and maintain a chemical composition of the seasoned etch solution with a molar ratio ranging from approximately 1 mol $NO_2$:2 mol nitric acid to approximately 1 mol $NO_2$:1 mol nitric acid, the seasoned etch solution comprises a mixture of 1 part used etch solution to 9 parts fresh solution, based on input from the first sensor and from the second sensor.

2. The etch solution recirculation system of claim 1, wherein the chemical cabinet is adapted to periodically dispense the fresh solution in a volume of about 10 to about 20% of total volume of the seasoned etch solution.

3. The etch solution recirculation system of claim 1, further comprising
a production wafer suspended above the solution bath.

4. The etch solution recirculation system of claim 1, further comprising:
a drain port at the bottom of the solution bath.

5. The etch solution recirculation system of claim 1, further comprising:
one or more additional silicon wafers suspended above the solution bath.

6. The etch solution recirculation system of claim 1, further comprising:
a spinning platform, wherein the silicon wafer is mounted on the spinning platform, wherein the controller manages a rate of rotation of the spinning platform.

7. The etch solution recirculation system of claim 1, wherein the controller manages an amount and speed of dispersion of the seasoned etch solution through the spray nozzle.

8. An etch solution recirculation system comprising:
a chemical cabinet comprising a first input, a second input and an output;
a solution bath with a silicon wafer comprising a boron dopant level equal to or greater than $1\times10^{19}$ atoms/cm$^3$ suspended above the solution bath;
a seasoned etch solution discharged from the chemical cabinet via the output and sprayed above the solution bath via a spray nozzle, the seasoned etch solution becomes used etch solution after coming in contact and reacting with the silicon wafer;

a re-circulation port located at a bottom of the solution bath, wherein the re-circulation port is connected to the first input of the chemical cabinet;

a storage tank connected to the second input of the chemical cabinet, the storage tank comprising a fresh solution, the fresh solution comprising hydrofluoric acid, nitric acid and acetic acid in an approximate 1:3:5 weight ratio, wherein the fresh solution is mixed in the chemical cabinet with the used etch solution from the solution bath to produce the seasoned etch solution;

a first sensor capable of measuring concentrations of $NO_x$ and $HNO_3$ in the seasoned etch solution, wherein a portion of the seasoned etch solution from the output of the chemical cabinet flows through the first sensor; and a controller connected to the chemical cabinet, the storage tank and the first sensor, the controller configured to perform a set of instructions to control and maintain a chemical composition of the seasoned etch solution with a molar ratio ranging from approximately 1 mol $NO_2$:2 mol nitric acid to approximately 1 mol $NO_2$:1 mol nitric acid, the seasoned etch solution comprises a mixture of 1 part used etch solution to 9 parts fresh solution, based on input from the first sensor.

9. The etch solution recirculation system of claim 8, wherein the chemical cabinet is adapted to periodically dispense the fresh solution in a volume of about 10 to about 20% of total volume of the seasoned etch solution.

10. The etch solution recirculation system of claim 8, further comprising:
a production wafer suspended above the solution bath.

11. The etch solution recirculation system of claim 8, further comprising:
a drain port at the bottom of the solution bath.

12. The etch solution recirculation system of claim 8, further comprising:
one or more additional silicon wafers suspended above the solution bath.

13. The etch solution recirculation system of claim 8, further comprising:
a spinning platform, wherein the silicon wafer is mounted on the spinning platform, wherein the controller manages a rate of rotation of the spinning platform.

14. The etch solution recirculation system of claim 8, wherein the controller manages an amount and speed of dispersion of the seasoned etch solution through the spray nozzle.

15. An etch solution recirculation system comprising:
a chemical cabinet comprising a first input, a second input and an output;
a solution bath with a silicon wafer comprising a boron dopant level equal to or greater than $1\times10^{19}$ atoms/cm$^3$ suspended above the solution bath;
a seasoned etch solution discharged from the chemical cabinet via the output and sprayed above the solution bath via a spray nozzle, the seasoned etch solution becomes used etch solution after coming in contact and reacting with the silicon wafer;

a re-circulation port located at a bottom of the solution bath, wherein the re-circulation port is connected to the first input of the chemical cabinet;

a storage tank connected to the second input of the chemical cabinet, the storage tank comprising a fresh solution, the fresh solution comprising hydrofluoric acid, nitric acid and acetic acid in an approximate 1:3:5 weight ratio, wherein the fresh solution is mixed in the chemical cabinet with the used etch solution from the solution bath to produce the seasoned etch solution;

a first sensor capable of measuring concentrations of $NO_x$ and $HNO_3$ in the seasoned etch solution, wherein a portion of the seasoned etch solution from the output of the chemical cabinet flows through the first sensor; and a controller connected to the chemical cabinet, the storage tank and the first sensor, the controller configured to perform a set of instructions to control and maintain the seasoned etch solution with a target molar ratio of $NO_2$ to nitric acid, based on input from the first sensor.

16. The etch solution recirculation system of claim 15, wherein the chemical cabinet is adapted to periodically dispense the fresh solution in a volume of about 10 to about 20% of total volume of the seasoned etch solution.

17. The etch solution recirculation system of claim 15, further comprising:

a production wafer suspended above the solution bath.

18. The etch solution recirculation system of claim 15, further comprising:

one or more additional silicon wafers suspended above the solution bath.

19. The etch solution recirculation system of claim 15, further comprising:

a spinning platform, wherein the silicon wafer is mounted on the spinning platform, wherein the controller manages a rate of rotation of the spinning platform.

20. The etch solution recirculation system of claim 15, wherein the controller manages an amount and speed of dispersion of the seasoned etch solution through the spray nozzle.

* * * * *